(12) United States Patent
Kaidoh et al.

(10) Patent No.: US 7,990,190 B2
(45) Date of Patent: Aug. 2, 2011

(54) POWER-ON RESET CIRCUIT, MODULE INCLUDING SAME, AND ELECTRONIC DEVICE INCLUDING SAME

(75) Inventors: Hanae Kaidoh, Tokyo (JP); Kazuyuki Tanaka, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/836,213

(22) Filed: Jul. 14, 2010

(65) Prior Publication Data

US 2011/0012651 A1    Jan. 20, 2011

(30) Foreign Application Priority Data

Jul. 17, 2009  (JP) ................. 2009-168473

(51) Int. Cl.
*H03L 7/00* (2006.01)

(52) U.S. Cl. ........................ 327/142; 327/143

(58) Field of Classification Search ............ None
See application file for complete search history.

(56) References Cited

U.S. PATENT DOCUMENTS

| | | | |
|---|---|---|---|
| 4,900,950 A * | 2/1990 | Dubujet ................. | 327/143 |
| 5,894,240 A * | 4/1999 | Shieh et al. ............. | 327/142 |
| 7,518,419 B1 * | 4/2009 | Pasqualini ............. | 327/143 |
| 2008/0036510 A1 * | 2/2008 | Kim ....................... | 327/143 |
| 2009/0195273 A1 * | 8/2009 | Lee ........................ | 327/143 |
| 2009/0206890 A1 * | 8/2009 | Park ....................... | 327/143 |

FOREIGN PATENT DOCUMENTS

JP    4424877    12/2009

* cited by examiner

*Primary Examiner* — Tuan Lam
(74) *Attorney, Agent, or Firm* — Cooper & Dunham, LLP

(57) ABSTRACT

A power-on reset circuit includes a charge-up circuit to charge a first capacitor after power is on, a first NOR circuit connected to an output terminal of the charge-up circuit and receive a power-on reset signal output from an output terminal of the power-on reset circuit, a first inverter connected to the first NOR circuit, a second capacitor connected between an input terminal of the first NOR circuit and an output terminal of the first inverter, a counter configured to count a clock, a clock selector configured to select whether to output or inhibit a clock signal based on an output signal from the counter, and a second inverter connected to the output terminal of the counter to output the power-on reset signal.

6 Claims, 5 Drawing Sheets

POR

POWER-ON RESET CIRCUIT, MODULE INCLUDING SAME, AND ELECTRONIC DEVICE INCLUDING SAME

TECHNICAL FIELD

The present disclosure relates to a power-on reset circuit, and more particularly, to a power-on reset circuit capable of stable operation, a module including the power-on reset circuit, and an electronic device including the power-on reset circuit.

BACKGROUND ART

Recently, a variety of high-performance electrical equipment, such as computer systems and mobile phones, have been developed rapidly and come to be used widely. Such electrical equipment often employs a power-on reset circuit to set the electrical equipment in an initial state to achieve stable operation when the power is turned on. More specifically, a power-on reset circuit resets internal circuits to an initial state to avoid erroneous operation.

As one example, FIG. 1 is a known power-on reset circuit disclosed in the JP-2003-032088-A.

As shown in FIG. 1, the power-on reset circuit includes an operating voltage setting circuit 11, a charging circuit 12, inverters INV11, INV12, and INV13, and a second capacitor C12. The inverters INV11, INV12, and INV13 are connected in series. The operating voltage setting circuit 11 includes a P-type MOS transistor P11 and a depression-type N-type MOS transistor ND11.

The charging circuit 12 includes a pair of P-type MOS transistors P12 and P13 and a first capacitor C11. One terminal of the first capacitor C11 is connected in series to the pair of P-type MOS transistors P12 and P13.

A gate of the P-type MOS transistor P11 is connected to a gate of the P-type MOS transistor P12. Sources of the P-type MOS transistor P11, P12, and P13 are commonly connected to a power supply (a power supply voltage Vcc). Further, a source of the N-type MOS transistor ND11 and another terminal of the first capacitor C11 are connected to ground.

As for the inverters INV11, INV12, and INV13, an input terminal of the inverter INV11 is connected to a junction node between the first capacitor C11 and drains of the P-type MOS transistors P12 and P13 from which a voltage signal (B1) is output. The output terminal of the inverter INV13 is connected to a gate of the P-type MOS transistor P13. The second capacitor C12 is connected between an input terminal of the inverter INV11 and an input terminal of inverter INV13. The inverter INV13 outputs a power-on reset signal POR.

Referring to changes in voltage shown in FIG. 2, operation of the power-on reset circuit of FIG. 1 will now be described.

FIG. 2 shows graphs representing changes in voltage with time of the power supply voltage Vcc and notable nodes of the power-on reset circuit shown in FIG. 1.

After power is supplied (refer to Vcc voltage in FIG. 2), the power supply voltage Vcc is increased gradually. When a difference voltage between the power supply voltage Vcc and a gate voltage of the P-type MOS transistor P11 exceeds a threshold voltage of the P-type MOS transistor P11, the operating voltage setting circuit 11 outputs a first output voltage at an output terminal of the P-type MOS transistor P11. The first output voltage is a lower voltage than the power supply voltage Vcc by a predetermined voltage. The first output voltage is input to a gate of the P-type MOS transistor P12 (B1 voltage wave in FIG. 2).

The P-type MOS transistor P12 is controlled by the first output voltage from the operating voltage setting circuit 11 to have a constant impedance, and starts to charge the first capacitor C11.

The output voltage (B1) at an output terminal of the charging circuit 12 is increased after some delay from the increase of the power supply voltage Vcc.

Since the output voltage (B1) at an output terminal of the charging circuit 12 is a low level initially, an output voltage (B2) of an output terminal of the inverter INV11 is a high level, an output voltage (B3) of an output terminal of the inverter INV12 is a low level, and an output voltage (POR) of an output terminal of the inverter INV13 is a high level. Accordingly, a power-on reset operation is started (OR voltage wave in FIG. 2).

With the charging of the first capacitor C11 the output voltage (B1) at an output terminal of the charging circuit 12 exceeds a logic threshold voltage of the inverter INV11 and the output voltage (B2) of the inverter INV11 changes from a high level to low level. The logic threshold voltage of the inverter INV11 is approximately half of the power supply voltage Vcc in the example circuit of FIG. 1 (B2 voltage wave in FIG. 2). Then, an output voltage (B3) of the output terminal of the inverter INV2 becomes a high level (B3 voltage wave in FIG. 2). Then, an output voltage (POR) of an output terminal of the inverter INV13 becomes a low level (POR voltage wave in FIG. 2). Accordingly, the power-on reset operation is released.

When an output voltage (POR) from an output terminal of the inverter INV13 becomes a low level, the P-type MOS transistor P13 is switched on. Accordingly, the impedance of the charging circuit 12 becomes low, resulting in a small time constant CR.

As a result, the output voltage (B1) at an output terminal of the charging circuit 12 is increased rapidly to a voltage almost equal to the power supply voltage Vcc. After that, the output voltage (B1) at an output terminal of the charging circuit 12 is kept at a high voltage above the logic threshold voltage of the inverter INV11 without dropping down. Accordingly, it is possible to avoid an erroneous operation.

Using the known power-on reset circuit described above, it may not be possible to obtain a stable operation when a rising speed of power supply voltage is slow. More specifically, when the rising speed of power supply voltage is slow, it is necessary to design the time constant of the charging circuit large so that the rising time of the output voltage (B1) at an output terminal of the charging circuit 12 becomes slow. As a result, it becomes possible to output the power with the reset signal POR reliably. Since the time constant of the charging circuit is determined by the P-type MOS transistor P12 and the capacitance of the capacitor C11, it is necessary to make the capacitor C11 large. Further, the duration of the high level of the power-on reset signal may vary due to irregularities arising during the manufacturing process and may not be enough to perform the power-on reset operation.

BRIEF SUMMARY

This patent specification describes a novel power-on reset circuit that includes a charge-up circuit to charge a first capacitor after power is turned on, a first NOR circuit connected to an output terminal of the charge-up circuit to receive a power-on reset signal output from output terminal of the power-on reset circuit, a first inverter connected in series to the first NOR circuit, a second capacitor connected between an input terminal of the first NOR circuit and an output terminal of the first inverter, a counter configured to count a clock, a clock selector configured to select whether a clock signal is output or inhibited based on an output signal from the counter, and a second inverter connected in series to the output terminal of the counter to output the power-on reset signal.

The counter is formed of at least one flip-flop circuit and receives an output signal of the clock selector. Whether the counter is reset is controlled by the output signal of the clock selector.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
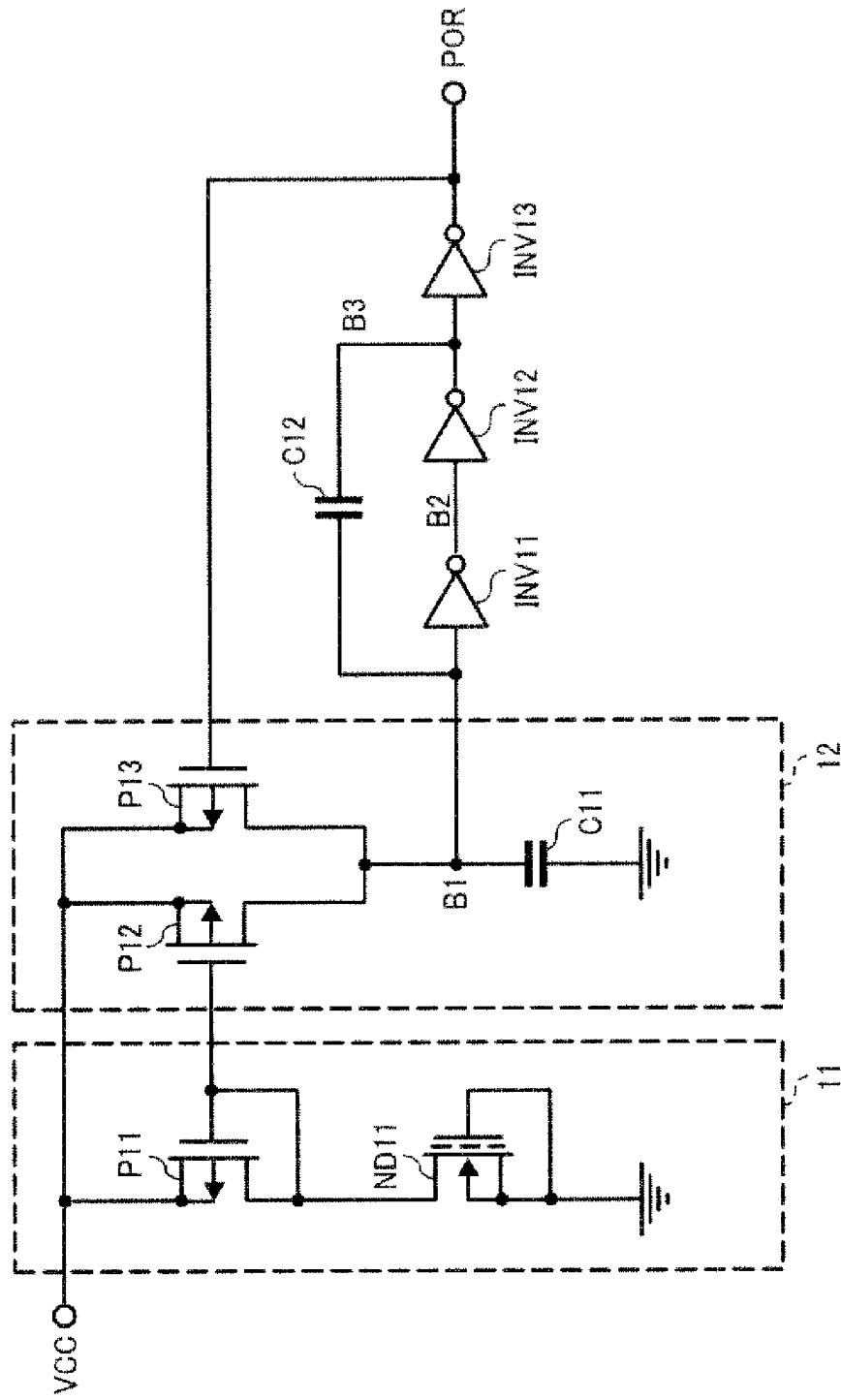
FIG. 1 is a circuit diagram of a known power-on reset circuit.
Figure 2:
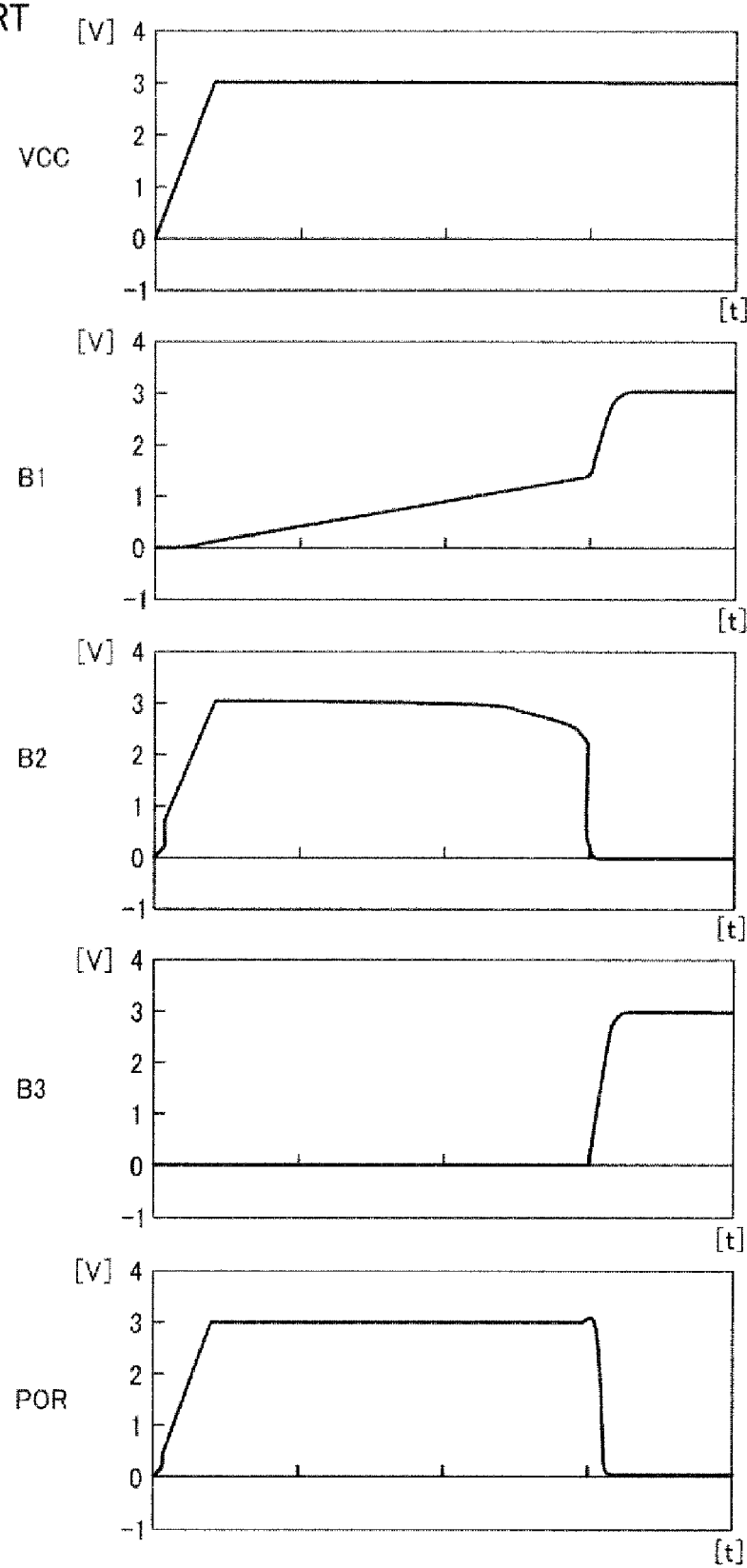
FIG. 2 represents changes in voltage with time for a power supply voltage Vcc and notable nodes in the power-on reset circuit of FIG. 1.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Figure 3:
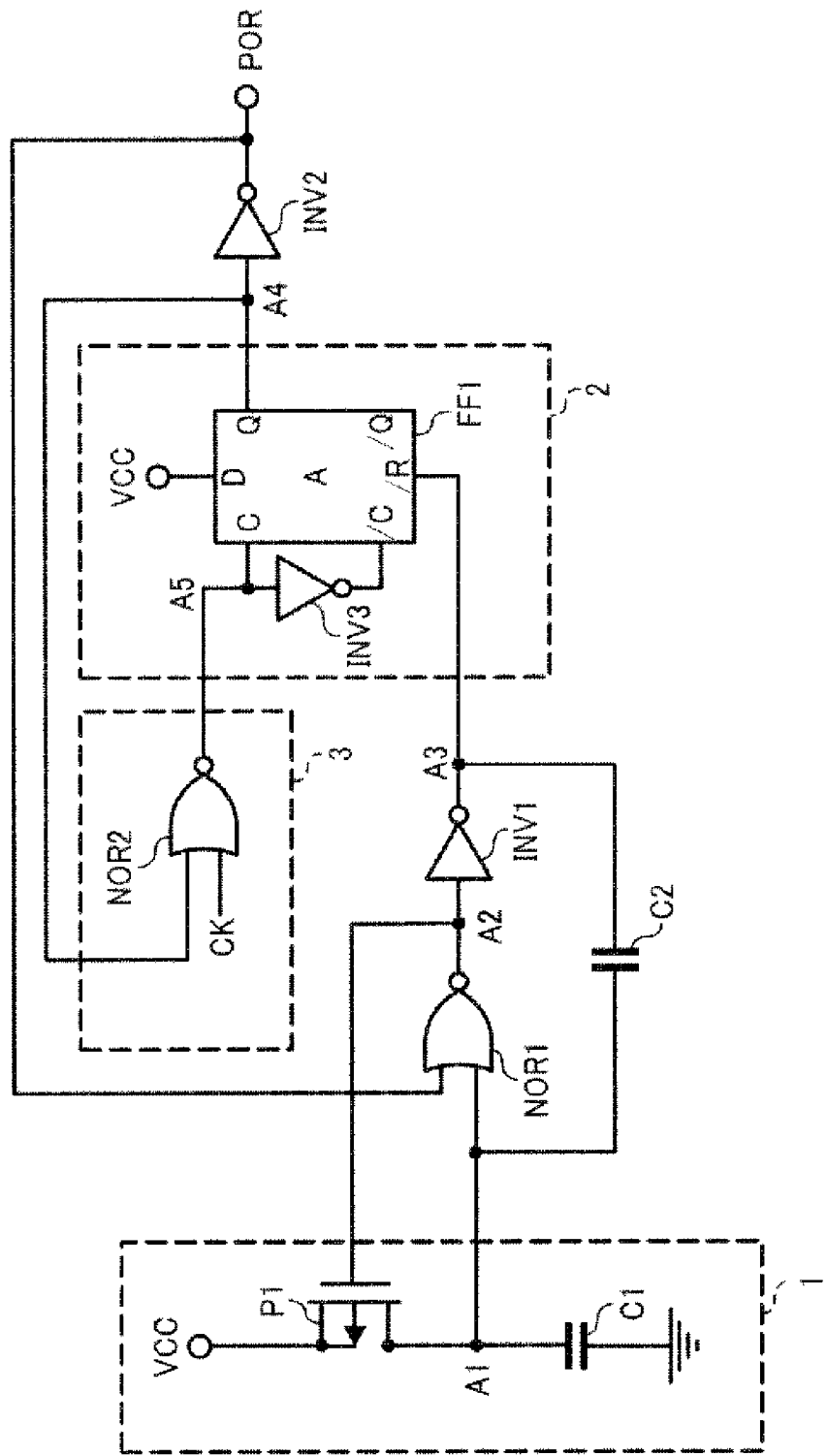
FIG. 3 is a circuit diagram of a power-on reset circuit according to a present invention.

Referring now to the drawings, wherein like reference numerals designate identical or corresponding parts throughout the several views, particularly to FIG. 3, a power-on reset circuit according to an illustrative embodiment is described.

FIG. 3 is a general circuit diagram of a power-on reset circuit according to an embodiment of the present invention.

As shown in FIG. 3, the power-on reset circuit includes a charging circuit 1, a NOR circuit NOR1, a first inverter INV1, a second capacitor C2, a counter 2, a clock selector 3, and a second inverter INV2.

The charging circuit 1 includes a P-type MOS transistor P1 and a first capacitor C1. The NOR circuit NOR1 receives an output signal (A1) output from a junction node between the P-type MOS transistor P1 and the first capacitor C1, and a power-on reset signal output from the power-on reset circuit.

The inverter INV1 is connected to the output of the NOR circuit NOR1. The second capacitor C2 is connected between an input terminal of the NOR circuit NOR1 and an output terminal of the inverter INV1 outputting a signal (A3), the counter 2 is reset by the output signal (A3) of the inverter INV1. The clock selector 3 selects whether a clock is output or inhibited. The inverter INV2 outputs a power-on reset signal. An output terminal of the NOR circuit NOR1 is connected to a gate of the P-type MOS transistor P1.

The counter 2 is formed of at least one flip-flop circuit, and may be formed of a plurality of flip-flop circuits. In the embodiment shown in FIG. 1, the counter 2 is formed of one flip-flop circuit FF1. The clock selector 3 is formed of a NOR circuit NOR2 that receives a clock signal and an output signal POR of the power-on reset circuit.

Figure 4A:
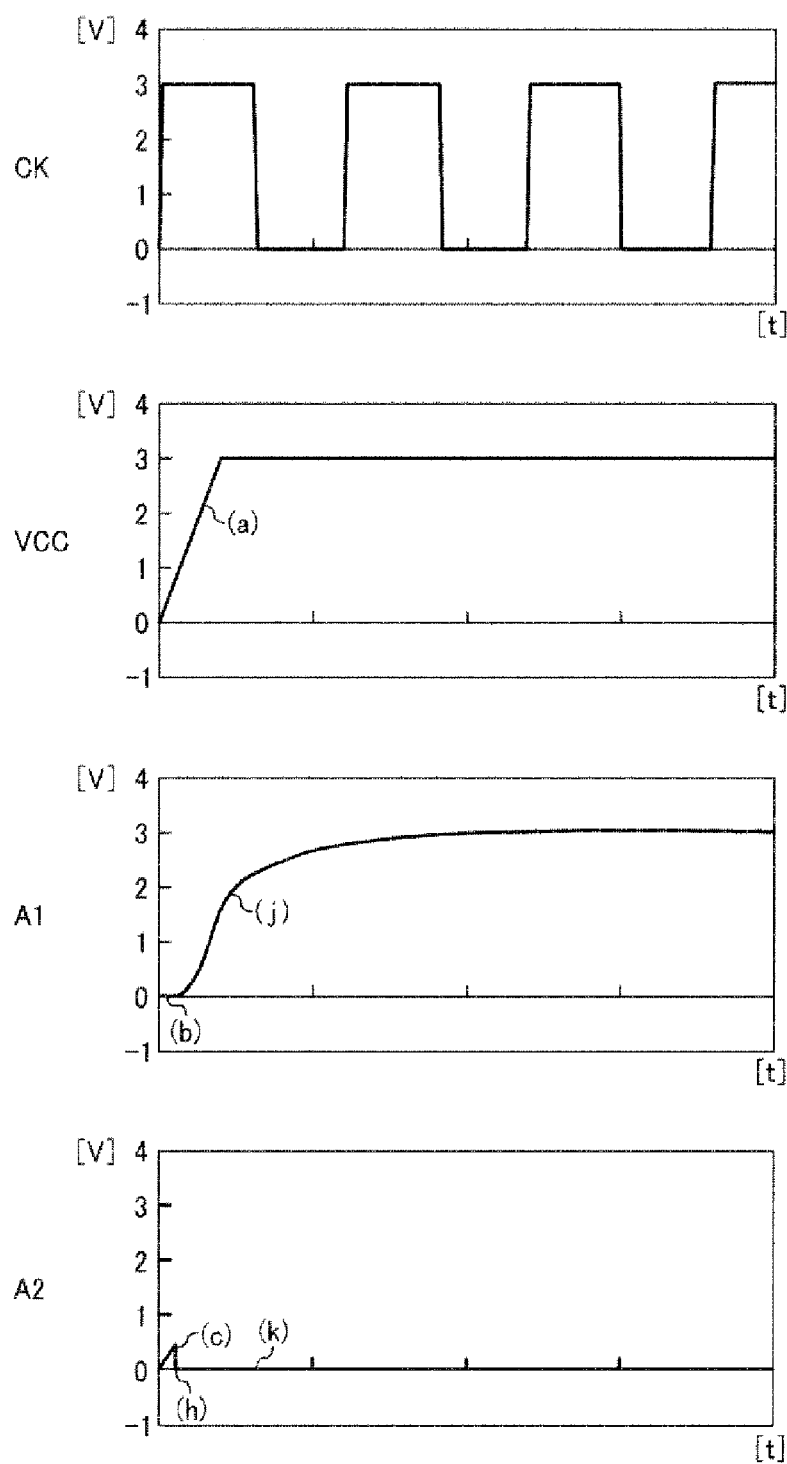
FIGS. 4A and 4B represent changes in voltage with time for a power supply voltage Vcc and notable nodes in the power-on reset circuit of FIG. 3.
Figure 4B:
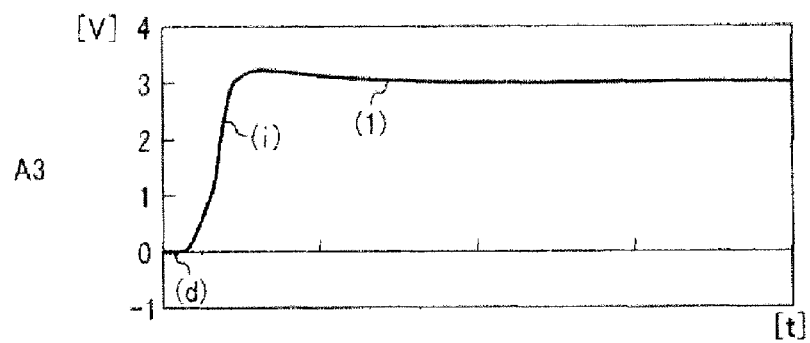
Figure 4B:
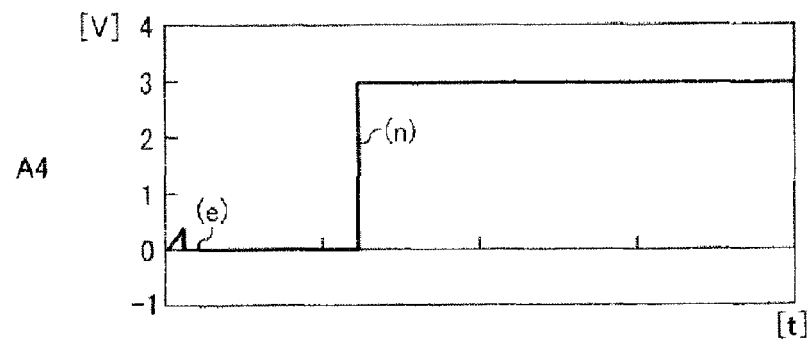
Figure 4B:
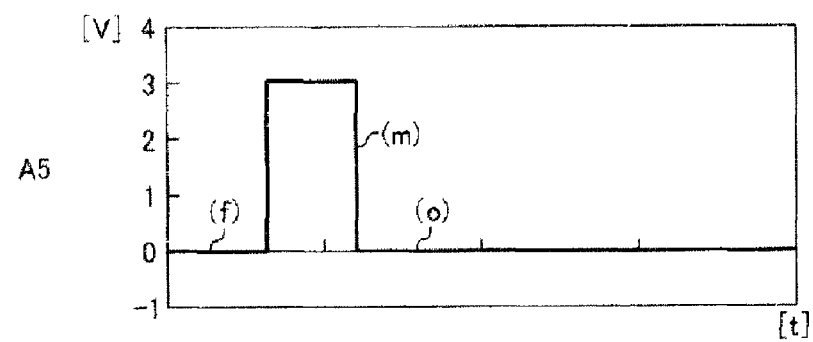
Figure 4B:
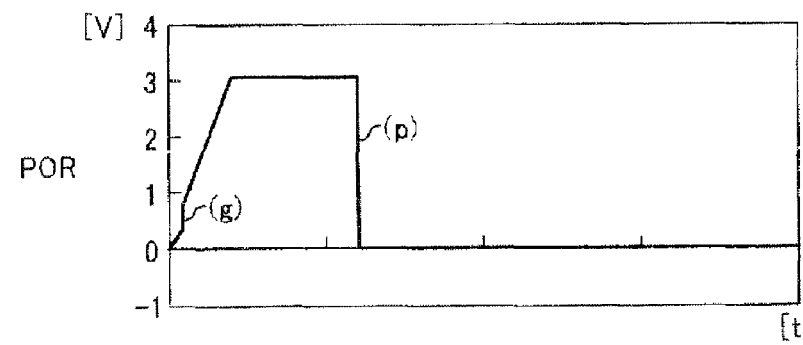

FIGS. 4A and 4B are graphs representing changes in voltage with time for a power supply voltage Vcc and notable nodes of the power-on reset circuit shown in FIG. 3.

Referring to the changes in voltage shown in FIGS. 4A and 4B, an operation of the power-on reset circuit shown in FIG. 3 will be now described.

When power is supplied, the power supply voltage Vcc is increased gradually with a certain increment ((a) in FIG. 4A). The charging circuit 1 starts charging when the power supply voltage Vcc exceeds the threshold voltage of the P-type MOS transistor P1 to switch the P-type MOS transistor P1 on. Accordingly, a voltage (A1) at a junction node between the P-type MOS transistor P1 and a first capacitor C1 is kept at 0v for a predetermined time after power is on.

One input signal (A1) for the NOR circuit NOR1 is a low level, however, another input signal (POR) is an unfixed state. Accordingly, an output voltage (A2) of the NOR circuit NOR1 is not determined and is being increased to follow the increase of the power supply voltage because the output node of the NOR circuit NOR1 is connected to the gate of the P-type MOS transistor P1. Since the inverter INV1, which receives the output signal (A2) from the NOR circuit NOR1, and an output terminal of the inverter INV1 is coupled with one input terminal of the NOR circuit NOR1 through the capacitor C2, an output signal (A3) of the inverter INV1 is a low level ((d) in FIG. 4B).

Since the output signal (A3) from the inverter INV1 is a low level, the flip-flop circuit in the counter 2 is forcibly reset. The counter 2 outputs a low level at an output terminal Q ((e) in FIG. 4B).

The capacitor C2 makes a voltage change of the output signal (A3) slow when the output signal (A3) output from the inverter INV1 changes from a low level to a high level. Accordingly, it becomes possible to reset the counter 2 reliably. Potentials between each terminal of the capacitor C2, i.e., the input signal (A1) for the NOR circuit NOR1 and the output signal (A3) from the inverter INV1, are almost equal to each other. Accordingly, no charge is stored in the capacitor C2.

As described, the clock selector 3 is formed of a NOR circuit. The clock selector 3 outputs a low level when a voltage (A4) at one of the input terminals of the NOR circuit NOR 2 is a high level, and outputs an inverted clock signal (A5) when an output voltage (A4) at the output terminal of the counter 2 is a low level.

When the counter 2 is forcibly reset and the output voltage (A4) at the output terminal of the counter 2 becomes a low level ((e) in FIG. 4B), the NOR circuit NOR 2 starts to output the inverted clock signal ((f) in FIG. 4B).

At the same time, a low level of the output voltage signal (A4) at an output terminal of the counter 2 is also input to the inverter INV2. An output signal of the inverter INV2, which is a power-on reset signal, becomes a high level ((g) in FIG. 4B). Accordingly, the power-on reset operation is started.

When the power-on reset signal POR becomes a high level, an output signal (A2) of the NOR circuit NOR 1 becomes a low level ((h) in FIG. 4A). Then, an output signal (A3) of the inverter INV1 becomes a high level. The forcible reset operation is released and a clock count operation is started.

Further, since a low level is input to the gate of the P-type MOS transistor P1 from the NOR circuit NOR1, the P-type MOS transistor P1 is switched on so that the charging circuit 1 starts a rapid charge-up operation. Accordingly, the output voltage (A1) of the charging circuit 1 is increased rapidly. When the output voltage (A1) of the charging circuit 1 exceeds the logic threshold voltage of the NOR circuit NOR1, the NOR circuit NOR1 outputs a low level independently of any other input signal for the NOR circuit NOR1. Accordingly, the output voltage (A3) of the inverter INV1 is kept at a high level ((i) in FIG. 4B). Consequently, it is possible to avoid an erroneous operation even when the power supply voltage Vcc is shifted.

The output of the flip-flop circuit FF1 of the counter 2 shown in FIG. 1 is changed at a falling edge of the input clock signal. When the output signal (A5), which is an inverted signal from the clock, is changed from a high level to a low level ((m) in FIG. 4B), the output voltage (A4) of the counter 2 changes from a low level to a high level ((n) in FIG. 4B).

When the output voltage (A4) of the counter 2 becomes a high level ((o) in FIG. 4B), the output voltage (A5) of the NOR circuit NOR 2 is fixed at a low level to stop the clock signal.

Further, when the output voltage (A4) of the counter 2 is a high level ((n) in FIG. 4B), the output voltage of the inverter INV2, which is the power-on reset signal (POR), becomes a low level ((p) in FIG. 4B). Consequently, the power-on reset operation is released.

Thus, according to the above-described embodiment, it is possible to generate a power-on reset signal reliably without erroneous operation. Further, it is possible to generate the power-on reset signal having a desired length unaffected by irregularities arising during the manufacturing process.

A variety of modifications and variations of the present embodiment are possible in light of the above teachings. For example, as noted previously, the counter 2 may be formed of a plurality of flip-flop circuits. With such configuration, the power-on reset pulse is output after counting a predetermined number of clock signals. Accordingly, it is possible to change the delay time to output the power-on reset pulse after power is on.

The power-on reset circuit described above may be integrated in a semiconductor module. Further, the semiconductor module may be installed in a variety of electronic equipment.

Numerous additional modifications and variations are possible in light of the above teachings. It is therefore to be understood that, within the scope of the appended claims, the disclosure of this patent specification may be practiced otherwise than as specifically described herein.

This patent specification is based on Japanese Patent Application No. 2009-168473 filed on Jul. 17, 2009 in the Japanese Patent Office, the entire contents of which are incorporated by reference herein.

What is claimed is:

1. A power-on reset circuit comprising:
a charge-up circuit to charge a first capacitor after power on;
a first NOR circuit to receive an output signal output from the charge-up circuit and a power-on reset signal output from an output terminal of the power-on reset circuit;
a first inverter connected to the first NOR circuit;
a second capacitor connected between an input terminal of the first NOR circuit and an output terminal of the first inverter;
a counter configured to count a clock;
a clock selector configured to select whether a clock signal is output or inhibited based on an output signal from the counter for output to the counter; and
a second inverter connected to the output terminal of the counter to output the power-on reset signal.

2. The power on reset circuit of claim 1,
wherein the charge-up circuit includes the first capacitor and a P-type MOS transistor to charge the first capacitor, and a source of the P-type MOS transistor is connected to a first power supply, a gate of the P-type MOS transistor is connected to an output terminal of the first NOR circuit, one end of the first capacitor is connected to a drain of the P-type MOS transistor, another end of the first capacitor is connected to a second power supply, and an output signal is output from a junction node between the P-type MOS transistor and the first capacitor.

3. The power-on reset circuit of claim 1,
wherein the counter comprises at least one flip-flop circuit and receives an output signal of the clock selector, and the flip-flop circuit is controlled by the output signal of the clock selector to determine whether the counter is reset.

4. The power-on reset circuit of claim 1,
wherein the clock selector comprises a second NOR circuit which receives the clock signal and an output signal of the counter and output an output signal to the counter.

5. A module that employs the power-on reset circuit of claim 1.

6. An electronic device that employs the power-on reset circuit of claim 1.

* * * * *